United States Patent
Oh et al.

(10) Patent No.: US 9,316,697 B2
(45) Date of Patent: Apr. 19, 2016

(54) MANAGEMENT SYSTEM AND ESTIMATING METHOD FOR BATTERY PARAMETER

(71) Applicant: SILICON WORKS CO., LTD., Daejeon-si (KR)

(72) Inventors: Hyung Seog Oh, Daejeon-si (KR); Ju Pyo Hong, Daejeon-si (KR); Chun Sik Chung, Suwon-si (KR); Yong Goo Kim, Daejeon-si (KR); Jae Wan Kim, Daejeon-si (KR); Chol Ho Kim, Daejeon-si (KR); Moon Young Kim, Daejeon-si (KR); Jun Ho Kim, Daejeon-si (KR); Jin Sik Park, Daejeon-si (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 694 days.

(21) Appl. No.: 13/691,045

(22) Filed: Nov. 30, 2012

(65) Prior Publication Data

US 2013/0166235 A1 Jun. 27, 2013

(30) Foreign Application Priority Data

Nov. 30, 2011 (KR) .................. 10-2011-0126772

(51) Int. Cl.
*G01R 31/36* (2006.01)
*G06F 17/13* (2006.01)

(52) U.S. Cl.
CPC ............ *G01R 31/3624* (2013.01); *G06F 17/13* (2013.01); *G01R 31/3651* (2013.01); *G01R 31/3662* (2013.01)

(58) Field of Classification Search
CPC ............... G01R 31/36; G01R 31/3606; G01R 31/3624; G01R 31/3631; G01R 31/3634; G01R 31/3651; G01R 31/3662; G01R 31/3679; G06F 17/13
See application file for complete search history.

(56) References Cited

U.S. PATENT DOCUMENTS

2013/0138369 A1* 5/2013 Papana et al. ................. 702/63

* cited by examiner

*Primary Examiner* — Toan Le
(74) *Attorney, Agent, or Firm* — Kile Park Reed & Houtteman PLLC (57) ABSTRACT

The present invention relates to a battery parameter management system and a battery parameter estimation method which are capable of simply estimating parameters of elements forming a battery equivalent model having a simple structure. The battery parameter system includes an amperemeter, a voltmeter, a control switch unit, and a processor, and the battery parameter estimation method includes supplying a pulse current, estimating resistance of an internal resistor, estimating capacitance of an internal capacitor, and estimating parameters of dynamic elements.

16 Claims, 7 Drawing Sheets

Sensing Period 1

MANAGEMENT SYSTEM AND ESTIMATING METHOD FOR BATTERY PARAMETER

CROSS REFERENCE TO RELATED APPLICATIONS

The present application claims priority of Korean Patent Application No. 10-2011-0126772, filed on Nov. 30, 2011, which is incorporated herein by reference in its entirety.

BACKGROUND OF THE INVENTION

1. Field of the Invention

The present invention relates to a battery, and more particularly, to a battery parameter management system and a battery parameter estimation method, which are capable of estimating parameters of elements forming a battery model which considers factors having an effect on inherent characteristics and operation characteristics of a secondary battery such as a lithium ion battery.

2. Description of the Related Art

When a secondary battery such as a lithium ion battery used as a power source of an electric driving motor of a hybrid electric vehicle is excessively discharged, the secondary battery may permanently lose the battery's characteristics. Furthermore, when the secondary battery is excessively charged, explosion or fire may occur. Therefore, attention must be paid to charging and discharging. In order to stably charge and discharge a battery, it is necessary to estimate the current state of the battery, that is, the state-of-charge (SOC) of the battery.

In order to accurately estimate the state of a battery, it is usual to select a battery equivalent model suitable for the battery. Outside the battery, only an open-circuit voltage of the battery and a current flowing in the battery can be measured. The measured voltage and current are used to estimate the parameters of electric elements forming the battery equivalent model.

When the battery equivalent model is set to have an excessively complex structure, it is naturally expected that an equation for estimating parameters of the elements used in the battery equivalent model will be complicated due to the electrical and physical characteristics of the elements and the electrical connection between the elements. When the battery equivalent model has a complex structure, a large number of function blocks to compute the complicated equation are required. Therefore, when the estimation for the parameters of the elements forming the battery equivalent model is implemented in hardware, the hardware may occupy a considerably large area. When the estimation for the parameters of the elements is implemented in software, a high-performance expensive processor is required.

Therefore, when the estimation is implemented in hardware or software, it is not easy to implement the estimation with one integrated circuit in terms of area and cost.

SUMMARY OF THE INVENTION

Accordingly, the present invention has been made in an effort to solve the problems occurring in the related art, and an object of the present invention is to provide a battery parameter management system capable of simply estimating parameters of elements forming a battery equivalent model having a simple structure.

Another object of the present invention is to provide a battery parameter estimation method capable of simply estimating parameters of elements forming a battery equivalent model having a simple structure.

In order to achieve the above object, according to one aspect of the present invention, a battery parameter management system includes: an amperemeter configured to detect an amount of current supplied to a battery from a current source or supplied from the battery to a load; a voltmeter configured to measure an open-circuit voltage of the battery; a control switch unit configured to transmit the current supplied from the current source to the battery or transmit the current outputted from the battery to the load in response to a control signal; and a processor configured to generate the control signal, apply the current and voltage measured by the amperemeter and the voltmeter to a battery equivalent model of the battery, and estimate parameters of elements forming the battery equivalent model, wherein the battery equivalent model includes: an internal resistor of the battery; an internal capacitor representing an open-circuit voltage of the battery; and a parallel circuit including a dynamic resistor and a dynamic capacitor which exhibit a non-linear operation characteristic based on an electrochemical reaction inside the battery, and the internal resistor, the internal capacitor, and the parallel circuit are connected in series.

According to another aspect of the present invention, there is provided a battery parameter estimation method of a battery equivalent model, which is applied to the battery parameter management system, The battery parameter estimation method includes: supplying a pulse current having a constant frequency during a pulse current supply period of a time period in which the battery is charged or discharge; estimating resistance of the internal resistor using a variation in charge current of the battery, a variation in discharge current of the battery, and a variation of the battery voltage during a first period of the pulse current supply period; estimating capacitance of the internal capacitor using the total amount of charge supplied the battery, the discharge amount of the battery, and a variation of the battery voltage during a second period of the pulse current supply period; and estimating resistance of the dynamic resistor and capacitance of the dynamic capacitor using a variation in charge current of the battery, a variation in discharge current of the battery, a variation of the battery voltage, and time constants of the dynamic resistor and the dynamic capacitor during a third period of the pulse current supply period.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Reference will now be made in greater detail to a preferred embodiment of the invention, an example of which is illustrated in the accompanying drawings. Wherever possible, the same reference numerals will be used throughout the drawings and the description to refer to the same or like parts.

Embodiments of the present invention provide a battery parameter estimation method capable of setting a battery equivalent model corresponding to an actual battery so as to estimate an SOC of the actual battery used in a vehicle without directly measuring the SOC, and estimating the parameters of electric elements forming a battery equivalent model using a current and voltage which are supplied to the actual battery and can be actually measured, and a battery parameter management system in which the battery parameter estimation method is performed.

Figure 1:
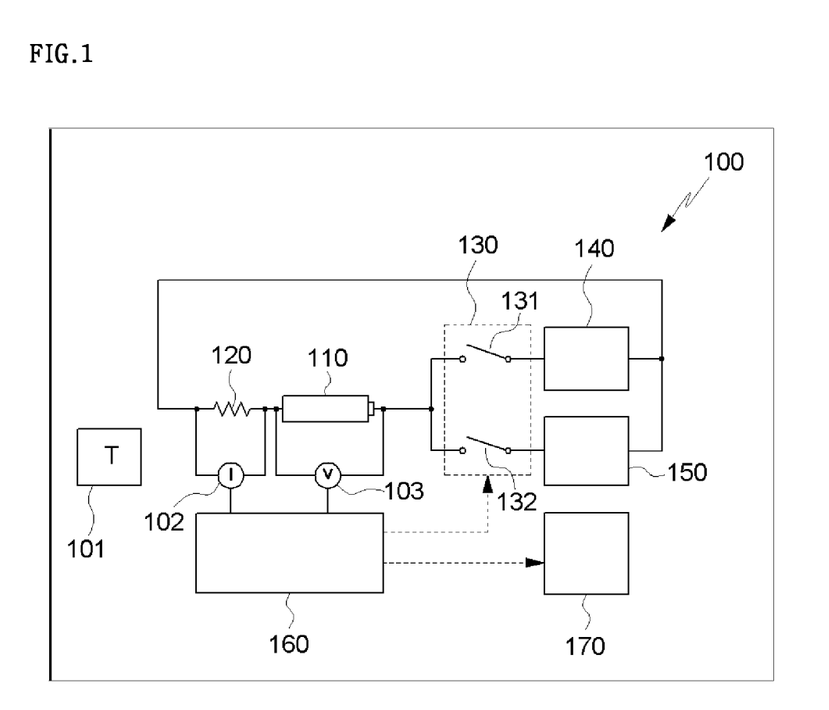
FIG. 1 is a battery management system in accordance with an embodiment of the present invention.

FIG. 1 is a battery management system in accordance with an embodiment of the present invention.

Referring to FIG. 1, the battery management system 100 includes a thermometer 101, an amperemeter 102, a voltmeter 103, a battery 110, a sensing resistor 120, a control switch unit 130, a current source 140, a load 150, a processor 160, and a user interface device 170.

The thermometer 101 is configured to measure the temperature of the battery 110. The amperemeter 102 is connected in parallel to the sensing resistor 120 connected in series to the battery 110, and configured to detect the amount of current inputted to or outputted from the battery 110. The voltmeter 103 is configured to measure a voltage applied across the battery 110, that is, an open-circuit voltage.

The control switch unit 130 is configured to transmit a current supplied from the current source 140 to the battery 110 or transmit a current outputted from the battery 110 to the load 150, in response to a charge control signal and a discharge control signal which are generated from the processor 160. The control switch unit 130 includes a charge control switch 131 and a discharge control switch 132. The charge control switch 131 is configured to switch the current supplied from the current source 140 to the battery in response to the charge control signal, and the discharge control switch 132 is configured to switch the current outputted from the battery 110 to the load 150 in response to the discharge control signal.

The processor 160 is configured to perform the following operations.

First, the processor 160 generates the charge control signal and the discharge control signal to control the switching operations of the two switches 131 and 132 included in the control switch unit 130.

Second, the processor 160 monitors the temperature of the battery, the current supplied to the battery 100 or outputted from the battery 110, and the open-circuit voltage of the battery 110, and calculates parameters of elements applied to an equivalent model of the battery using the monitored temperature, current, and open-circuit voltage of the battery. At this time, in order to calculate the parameters of the elements applied to the battery equivalent model, the processor 160 controls the charge control signal such that the current supplied to the battery has a pulse form with a constant frequency during a part of the period in which the battery is charged, and controls the discharge control signal such that the current supplied to the load from the battery has a pulse form with a constant frequency during a part of the period in which the battery is discharged.

The user interface device 170 such as a personal computer handles a part of functions performed by the processor 160, and may be added to a system, if necessary.

Figure 2:
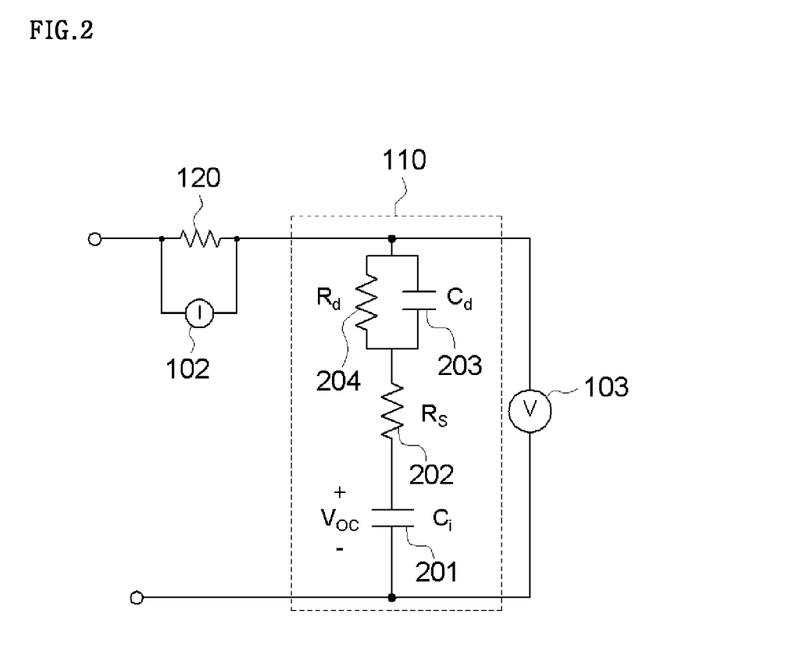
FIG. 2 illustrates a battery equivalent model used in a battery parameter estimation method in accordance with the embodiment of the present invention.

FIG. 2 illustrates a battery equivalent model used in a battery parameter estimation method in accordance with the embodiment of the present invention.

Referring to FIG. 2, the battery equivalent model 110 used in the battery parameter estimation method in accordance with the embodiment of the present invention has a structure in which a dynamic resistor 204 and a dynamic capacitor 203 which are connected in parallel are connected in series to an internal resistor 202 and an internal capacitor 201. The internal resistor 202 represents an inherent resistance component of the battery, and the internal capacitor 201 represents an open-circuit voltage $V_{OC}$ of the battery in a state where a load is not connected to the battery. The dynamic resistor 204 and the dynamic capacitor 204 which are connected in parallel represent a non-linear operation characteristic based on an electrochemical reaction inside the battery.

The embodiments of the present invention provide the battery parameter estimation method applied to the simple battery equivalent model as illustrated in FIG. 2 such that an expensive processor is not required when the parameters of the elements forming the battery equivalent model 110 are estimated.

In the following descriptions, the voltage of the battery indicates a voltage measured by the voltmeter 103, and the current supplied to the battery, that is, the current inputted to or outputted from the battery indicates a current measured by the amperemeter 102.

Figure 3:
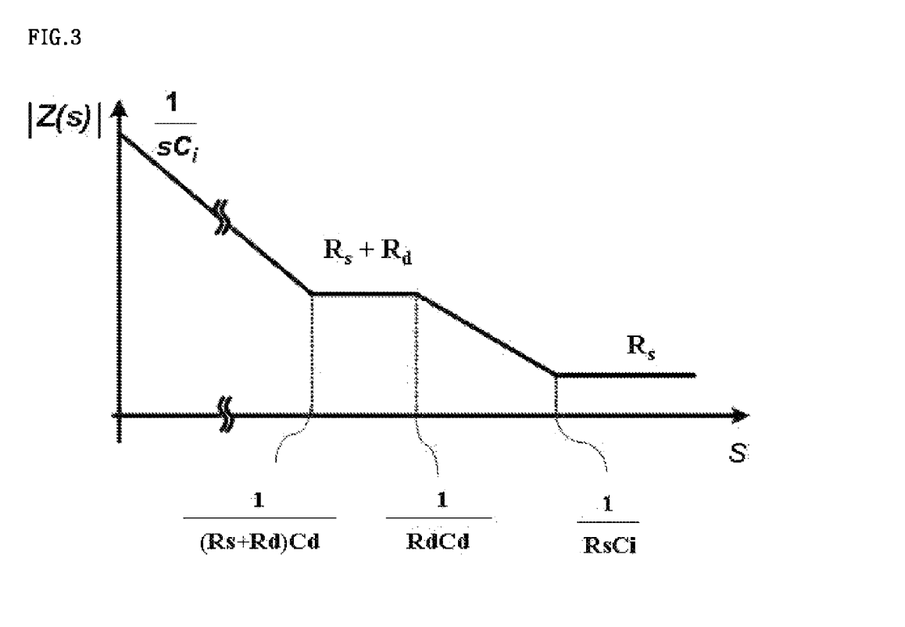
FIG. 3 illustrates battery impedance depending on the frequency of a pulse current supplied to a battery.

FIG. 3 illustrates battery impedance depending on the frequency of a pulse current supplied to the battery.

Referring to FIG. 3, until the frequency s of the pulse current supplied to the battery 110 of the battery management system 100 of FIG. 1 approaches a first frequency $f_1$ from 0, the impedance $Z(s)$ of the battery may be expressed as Equation 1 below, and the first frequency $f_1$ may be expressed as Equation 2 below.

$$Z(s) = \frac{1}{sC_i} \qquad \text{[Equation 1]}$$

$$f_1 = \frac{1}{(R_s + R_d)C_d} \qquad \text{[Equation 2]}$$

Here, s represents the frequency of the pulse current, and $C_i$ represents capacitance of the internal capacitor 201. According to Equation 1, since the internal capacitor 201 is opened when the frequency of the pulse current applied to the battery 110 is lower than the first frequency $f_1$, the impedance $Z(s)$ of the battery is inverse proportional to the product of the capacitance $C_i$ and the frequency s. In other words, the impedance $Z(s)$ of the battery decreases as the frequency s increases. According to Equation 2, the first frequency $f_1$ is inverse proportional to the product of the sum of resistance $R_S$ of the internal resistor 202 and resistance $R_d$ of the dynamic resistor 204 and capacitance $C_d$ of the dynamic capacitor 203.

The impedance $Z(s)$ of the battery between the first frequency $f_1$ and a second frequency $f_2$ may be expressed as Equation 3 below, and the second frequency $f_2$ may be expressed as Equation 4 below.

$$Z(s) = R_s + R_d \qquad \text{[Equation 3]}$$

$$f_2 = \frac{1}{R_d C_d} \qquad \text{[Equation 4]}$$

According to Equation 3, when the pulse current has a frequency between the first and second frequencies $f_1$ and $f_2$, the internal capacitor 201 is shorted, and the dynamic capacitor 203 is opened. According to the Equation 4, the second frequency $f_2$ is inverse proportional to the product of the resistance $R_d$ of the dynamic resistor 204 and the capacitance $C_d$ of the dynamic capacitor 203.

When the frequency of the pulse current is equal to or higher than a third frequency $f_3$, the impedance of the battery may be expressed as Equation 5 below, and the third frequency $f_3$ may be expressed as Equation 6 below.

$$Z(s) = R_s \qquad \text{[Equation 5]}$$

$$f_3 = \frac{1}{R_s C_i} \qquad \text{[Equation 6]}$$

According to Equation 5, when the frequency of the pulse current is equal to or higher than the third frequency $f_3$, both of the internal capacitor 201 and the dynamic capacitor 203 are shorted. That is, when a voltage sensing value and the next voltage sensing value are changed to a predetermined value or more, the voltage change is caused by the internal resistor 202 of the battery equivalent model. Therefore, it is possible to estimate the resistance of the internal resistor 202 through the method in accordance with the embodiment of the present invention. Since the capacitor does not respond to a rapid current change but is shorted, the impedance of the capacitor at this time becomes zero.

According to Equation 6, the third frequency $f_3$ is inverse proportional to the product of the resistance $R_s$ of the internal resistor 202 and the capacitance $C_i$ of the internal capacitor 201.

Hereafter, a method for estimating the resistance $R_3$ of the internal resistor 202, the capacitance $C_i$ of the internal capacitor 201, the resistance $R_d$ of the dynamic resistor 204, and the capacitance $C_d$ of the dynamic capacitor 203, based on the change of the battery impedance depending on the frequency change of the pulse current in FIG. 3, will be described.

In the following descriptions, suppose that a pulse current having a predetermined frequency is supplied to the battery during a part of a predetermined time period in which the battery is charged. A method for deciding an optimal frequency of the pulse current will be described below.

Figure 4:
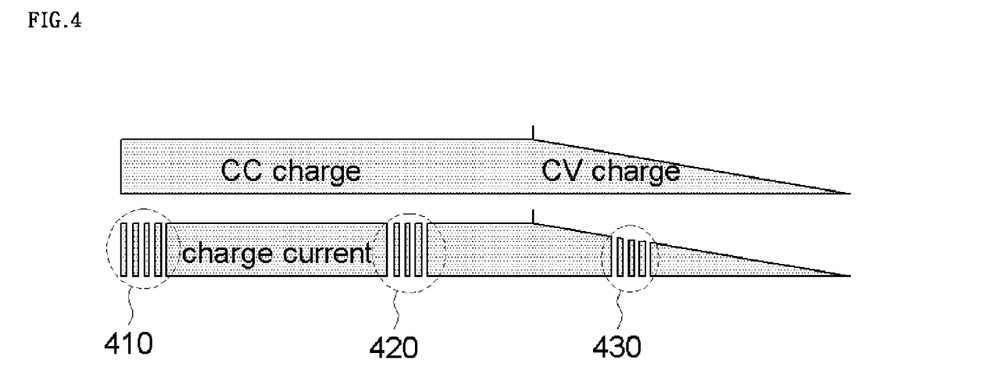
FIG. 4 illustrates charge and discharge operations applied to the battery management system in accordance with the embodiment of the present invention.

FIG. 4 illustrates charge and discharge operations applied to the battery management system in accordance with the embodiment of the present invention.

Referring to FIG. 4, the charge control signal is used to switch on/off the charge control switch 131 such that a constant current supplied to the battery 110 from the current source 140 has a pulse form during some periods 410 and 420 of a constant current charge period CC Charge in which the battery 110 is charged with the constant current. Similarly, the discharge control signal is used to switch on/off the charge control switch 131 such that a current supplied to the load 150 from the battery 110 has a pulse form in a predetermined period 430 of a constant voltage charge CV Charge in which a constant voltage is discharged from the battery 110. In the following descriptions, a pulse current waveform is generated by the method illustrated in FIG. 4.

Referring to FIG. 3 and Equations 5 and 6, during a first period in which the frequency of the pulse current is equal to or higher than the third frequency $f_3$ corresponding to a high frequency, both of the internal capacitor 201 and the dynamic capacitor 203 are shorted, and thus the impedance $Z(s)$ in the first period is equal to the resistance $R_S$ of the internal resistor 202.

In this embodiment of the present invention, a high-frequency pulse current equal to or higher than the third frequency $f_3$ corresponding to the first period is required. This high-frequency pulse current may be generated by increasing the switch on/off speed of the charge control switch 131, or a short time period in which the value of the pulse current instantly transits may be used to generate the high-frequency pulse current. When a low-frequency pulse current is generated and provided to the battery instead of the high-frequency pulse current, it is possible to reduce power consumption based on the frequency of the pulse current.

Figure 5:
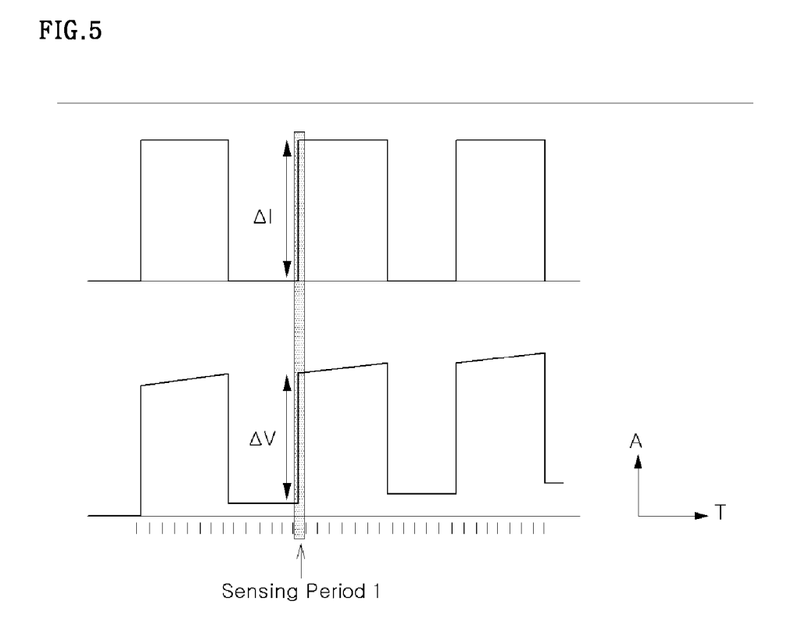
FIG. 5 illustrates voltage and current waveforms in a first period which are applied to a step of estimating the resistance of an internal resistor.

FIG. 5 illustrates voltage and current waveforms in the first period which are applied to a step of estimating the resistance of the internal resistor.

Referring to FIG. 5, the resistance $R_S$ of the internal resistor 202 is estimated using a variation $\Delta I$ of the current supplied to the battery and a variation $\Delta V$ of the battery voltage during the first period of the pulse current supply period. The resistance $R_S$ of the internal resistor 202 is expressed as Equation 7 below.

$$R_s = \frac{\Delta V}{\Delta I} \qquad \text{[Equation 7]}$$

In the following descriptions, the impedance in the first period is estimated using voltages and currents of the battery during a transition period of a low-frequency pulse current and a transition period of a high-frequency pulse current.

In this embodiment of the present invention, the impedance is estimated in a first sensing period Sensing Period1 in which the pulse current transits from a low current level to a high current level.

Referring to FIG. 5, the battery voltage also transits from a low voltage level to a high voltage level during the first sensing period Sensing Period1. When a current variation $\Delta I$ corresponding to a current level difference of the pulse current and a voltage variation $\Delta V$ corresponding to a voltage level difference between both ends of the battery 110 in the first sensing period Sensing Period1 are applied to Equation 7, the resistance $R_S$ of the internal resistor 202 may be easily estimated.

Referring to FIG. 3 and Equations 1 and 2, during a second period in which the frequency of the pulse current is less than the first frequency $f_1$ corresponding to a low frequency, the internal capacitor 201 is opened. Therefore, the voltage of the battery 110 is equalized to the battery open-circuit voltage $V_{OC}$, and the impedance Z(s) of the battery 110 in the second period is inverse proportional to the product of the frequency s and the capacitance $C_i$ of the internal capacitor 201. During the second period, the internal capacitor 201 slowly responds to the change of the pulse current. Therefore, the capacitance $C_1$ of the internal capacitor 201 may be estimated by integrating current values to calculate the total charge amount ΔQ during a second sensing period Sensing Period2 which will be described below and dividing the total charge amount by an open-circuit voltage variation $\Delta V_{OC}$ in the second sensing period Sensing Period2.

In FIG. 5, arrows at the right bottom mean that an x-axis of FIG. 5 indicates the time and a y-axis indicates the amplitude. In the following drawings, this indication will be applied in the same manner.

Figure 6:
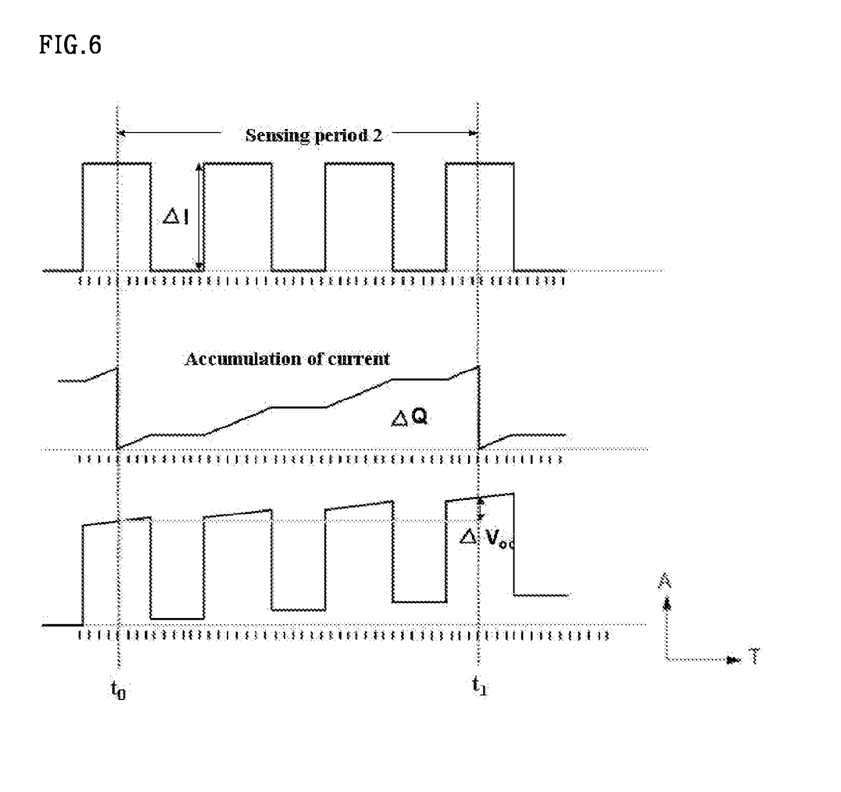
FIG. 6 illustrates voltage and current waveforms in a second period which are applied to a step of estimating the capacitance of an internal capacitor.

FIG. 6 illustrates voltage and current waveforms in the second period which are applied to a step of estimating the capacitance of the internal capacitor.

Referring to FIG. 6, the open-circuit voltage variation $V_{OC}$ indicates a difference between an open-circuit voltage at a start time point $t_0$ of the second sensing period Sensing Period2 and an open-circuit voltage at an end time point $t_1$ of the second sensing period Sensing Period2. The capacitance $C_i$ of the internal capacitor 201 is estimated using the total charge amount ΔQ supplied to the battery and the battery open-circuit voltage variation $\Delta V_{OC}$ during the second sensing period Sensing Period2 of the pulse current supply period. The capacitance $C_i$ of the internal capacitor 201 is expressed as Equation 8 below.

$$C_i = \frac{\Delta Q}{\Delta V_{OC}} = \frac{\int_0^{\Delta t} i(t)dt}{\Delta V_{OC}} \qquad \text{[Equation 8]}$$

Here, the total charge amount ΔQ represents the total amount of charge supplied to the battery 110 during Δt ($=t_1-t_0$), i represents a current supplied to the battery 110, and $\Delta V_{OC}$ represents a variation of the battery open-circuit voltage increased by the total charge amount ΔQ.

During a third period defined between the first and second frequencies $f_1$ and $f_2$, the parameters of the dynamic elements are estimated by a method to be described below.

Figure 7:
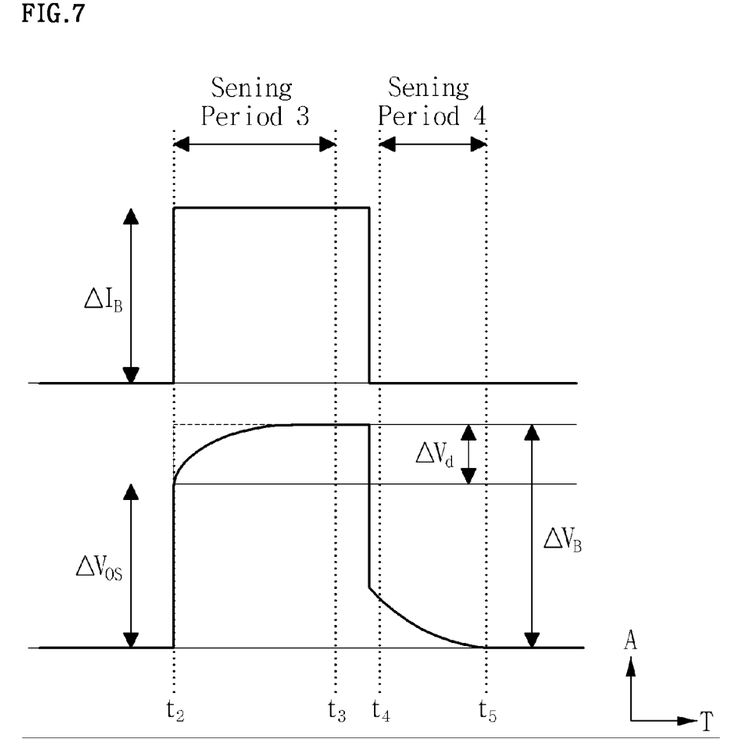
FIG. 7 illustrates voltage and current waveforms in a third period which are applied to a step of estimating the parameters of dynamic elements.

FIG. 7 illustrates voltage and current waveforms in the third period which are applied to a step of estimating the parameters of the dynamic elements.

Referring to FIG. 7, the step of estimating the parameters of the dynamic elements may be divided into two processes of estimating the resistance $R_d$ of the dynamic resistor 204 and the capacitance $C_d$ of the dynamic capacitor 203, respectively. One cycle of a pulse current includes two sensing periods Sensing Period3 and Sensing Period4. During the third sensing period Sensing Period3 ($t_2$~$t_3$) in which the amplitude of the current rapidly increases and then maintains a constant value, the resistance $R_d$ of the dynamic resistor 204 is estimated. During the fourth sensing period Sensing Period4 ($t_4$~$t_7$) in which the amplitude of the current rapidly decreases and then maintains a constant value after the third sensing period ($t_2$~$t_3$) passes, the capacitance $C_d$ of the dynamic capacitor 203 is estimated.

First, the process of estimating the resistance $R_d$ of the dynamic resistor 204 during the third sensing period ($t_2$~$t_3$) will be described.

During the third sensing period ($t_2$~$t_3$), a voltage variation $\Delta V_B$ of the battery, which is caused as the amplitude of the pulse current is changed ($\Delta I_B$), may be expressed as Equation 9 below.

$$\Delta V_B = \Delta V_d + \Delta V_{OS} \simeq \Delta V_d = \frac{R_d}{\Delta I} \qquad \text{[Equation 9]}$$

The capacitance $C_i$ of the internal capacitor 201 of the battery 110 is much larger than the capacitance $C_d$ of the dynamic capacitor 203. Therefore, when the frequency of the pulse current is properly adjusted, the impedance of the internal capacitor 201 may be set to be larger than the parallel impedance of the dynamic 204 and the dynamic capacitor 203 which are connected in parallel. Therefore, the change of the pulse current at a moment $t_2$ when the pulse current rapidly transits from a low current level to a high current level appears as a dropping voltage $\Delta V_{OS}$ in the internal capacitor 201. After this moment $t_2$, the pulse current having a high current level has no effect on the internal capacitor 201, and a voltage drop $\Delta V_d$ occurs in the parallel circuit of the dynamic resistor 204 and the dynamic capacitor 203.

The resistance $R_d$ of the dynamic resistor 204 in Equation 9 may be expressed as Equation 10 below.

$$R_d = \frac{\Delta V_d}{\Delta I} \approx \frac{V(t_3) - V(t_2)}{\Delta I} \qquad \text{[Equation 10]}$$

Here, $t_3$ represents a time point when the amplitude of the current supplied to the battery 110, that is, the current level rapidly increases, and $t_3$ represents a time point when the voltage level of the battery 110 is saturated within the third sensing period Sensing period3. Before the time point $t_4$ when the amplitude of the current supplied to the battery 201 rapidly decreases, the voltage level of the battery must be saturated. When the frequency of the pulse current is properly selected, such a condition may be satisfied. This will be described below.

The time point $t_4$ when the fourth sensing period ($t_4$~$t_7$) starts corresponds to a moment when the amplitude of the current supplied to the battery 110 rapidly decreases. At this time, the open-circuit voltage $\Delta V_{OS}$ of the battery 110 rapidly decreases in the internal capacitor 201, but the dropping voltage $\Delta V_d$ in the parallel circuit decreases exponentially. This is because the dynamic resistor 204 is connected in parallel to the dynamic capacitor 203, and the battery voltage at the time point $t_4$ becomes the dropping voltage $\Delta V_d$ in the parallel circuit. The time point $t_7$ which is the last time point of the fourth sensing period ($t_4$~$t_7$) corresponds to a moment when time constants τ of the dynamic resistor 204 and the dynamic capacitor 203 are tripled (3τ).

For convenience of description, the fourth sensing period ($t_4$~$t_7$) is defined as a time period in which the time constants τ of the dynamic resistor 204 and the dynamic capacitor 203 are tripled (3τ). The fourth sensing period ($t_4$~$t_7$) may be further decreased or increased.

Hereafter, the process of estimating the capacitance $C_d$ of the dynamic capacitor 203 will be described.

Figure 8:
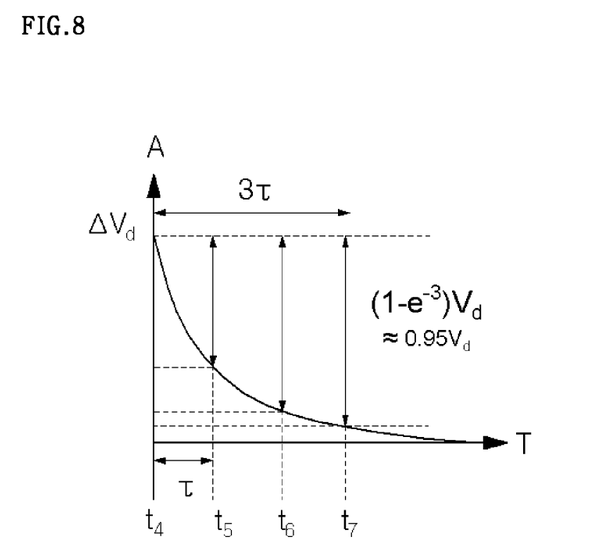
FIG. 8 is an expanded diagram of the voltage waveform of the fourth sensing period.

FIG. 8 is an expanded diagram of the voltage waveform of the fourth sensing period.

Referring to FIG. 8, the voltage level $\Delta V_d$ of the battery at the start time point $t_4$ of the fourth sensing period Sensing Period4 decreases exponentially with time, and the fourth sensing period Sensing Period4 is divided into three sub periods using the time constant decided by the resistance $R_d$ of the dynamic resistor 204 and the capacitance $C_d$ of the dynamic capacitor 203.

The three sub periods include a moment $t_5$ when the voltage level becomes about 36.2% of the voltage level $\Delta V_d$ at the time point $t_4$, a moment $t_6$ when the voltage level becomes about 13.5% of the voltage level $\Delta V_d$ at the time point $t_4$, and a moment $t_7$ when the voltage level becomes about 0.05% of the voltage level $\Delta V_d$ at the time point $t_4$, respectively.

The voltage levels may be expressed as Equation 11 below.

$$V(t_4)-V(t_5) \geq (1-e^{-1})\Delta V_d \approx 0.632\Delta V_d;$$

$$V(t_4)-V(t_6) \geq (1-e^{-2})\Delta V_d \approx 0.865\Delta V_d;$$

$$V(t_4)-V(t_7) \geq (1-e^{-3})\Delta V_d \approx 0.950\Delta V_d \quad \text{[Equation 11]}$$

When Equation 11 and the concept of the time constant are used, the capacitance $C_d$ of the dynamic capacitor 203 may be estimated as Equation 12 below.

$$C_d = \text{average}\left(\frac{t_5-t_4}{R_d}, \frac{t_6-t_4}{2R_d}, \frac{t_7-t_4}{3R_d}\right) \quad \text{[Equation 12]}$$

In Equation 12, three sub periods are averaged to calculate the capacitance $C_d$ of the dynamic capacitor 203. However, one sub period selected among three sub periods may be used to estimate the capacitance $C_d$ of the dynamic capacitor 203, or two sub periods selected among three sub periods may be averaged to estimate the capacitance $C_d$ of the dynamic capacitor 203.

Figure 9:
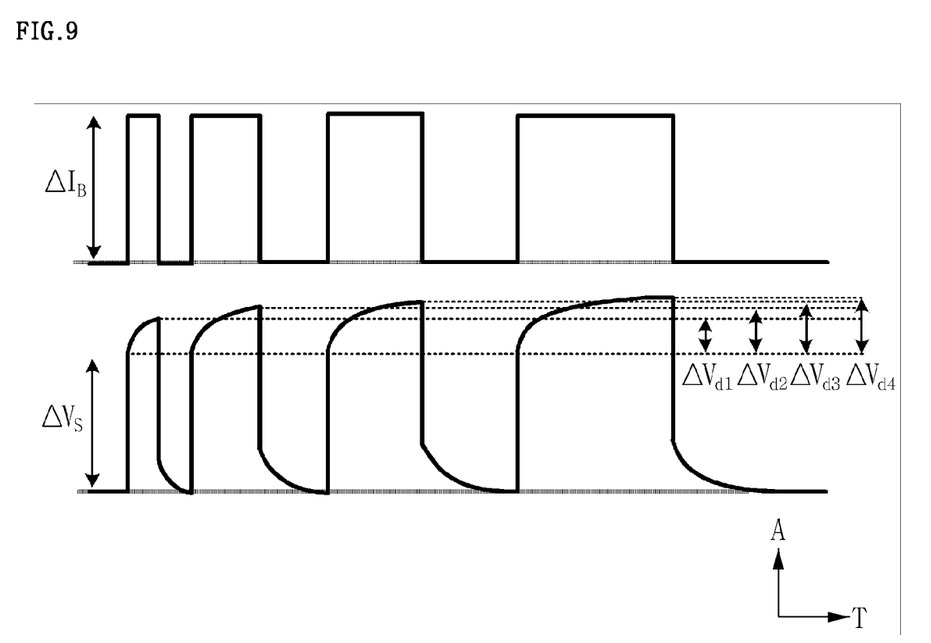
FIG. 9 illustrates a process of deciding the frequency of a pulse current suitable for the step of estimating the parameters of the dynamic elements

FIG. 9 illustrates a process of deciding the frequency of a pulse current suitable for the step of estimating the parameters of the dynamic elements.

Referring to FIG. 9, in order to decide the frequency of a pulse current which satisfies a condition at which the amplitude of the battery voltage must be saturated before the time point $t_4$ when the amplitude of the current supplied to the battery rapidly decreases at the step of estimating the parameters of the dynamic elements, differences between the respective battery voltages $\Delta V_{d1}$, $\Delta V_{d2}$, $\Delta V_{d3}$, and $\Delta V_{d4}$ are compared to a constant threshold value $\Delta V_{th}$ while the frequency of the pulse current is changed. This may be expressed as Equation 13 below.

$$\Delta V_{dn} - \Delta V_{d(n-1)} \leq V_{th} \quad \text{[Equation 13]}$$

Here, n is a natural number equal to or larger than two.

When a difference between battery voltages corresponding to a pulse current having two different frequencies is smaller than the threshold value $V_{th}$, one of the two frequencies may be decided as the frequency of the pulse current. In this case, the frequency of the pulse current satisfies the condition at which the amplitude of the battery voltage must be saturated before the time point $t_4$ when the amplitude of the current supplied to the battery rapidly decreases.

Figure 10:
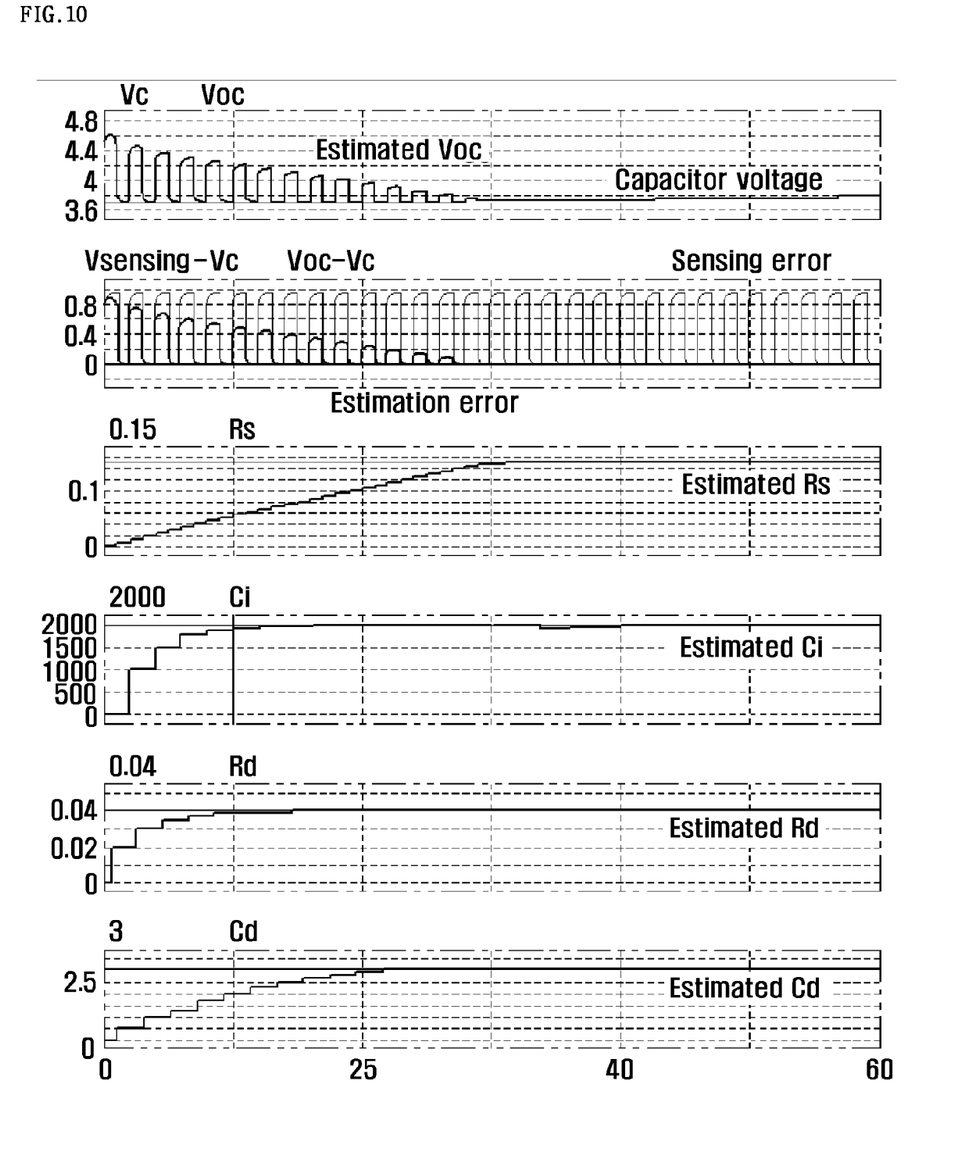
FIG. 10 illustrates results of a computer simulation to which the battery parameter estimation method in accordance with the embodiment of the present invention is applied.

FIG. 10 illustrates results of a computer simulation to which the battery parameter estimation method in accordance with the embodiment of the present invention is applied.

Referring to FIG. 10, when the battery parameter estimation method in accordance with the embodiment of the present invention is applied after parameters are arbitrarily set, the arbitrarily-set parameters may be accurately estimated after a predetermined time passes. In the computer simulation, the resistance of the internal resistor 202 was set to 0.15Ω, the capacitance $C_i$ of the internal capacitor 201 was set to 2,000 pF, the resistance $R_d$ of the dynamic resistor 204 was set to 0.04Ω, and the capacitance $C_d$ of the dynamic capacitor 203 was set to 3 pF. The estimated resistance Estimated $R_s$ of the internal resistor 202, the estimated capacitance Estimated $C_i$ of the internal capacitor 201, the estimated resistance Estimated $R_d$ of the dynamic resistor 204, and the estimated capacitance Estimated $C_d$ of the dynamic capacitor 203 were decided as the same values as the arbitrarily-set values before 30 seconds passed after the simulation was started, and the resistance $R_i$ of the internal resistor 202 was estimated the latest.

Referring to the uppermost simulation result of FIG. 10, the open-circuit voltage $V_c$ of the internal capacitor 201 in the simulation has a constant value which does not change with time. However, the estimated open-circuit voltage $V_{OC}$ of the battery converges to the open-circuit voltage $V_C$ of the internal capacitor 201 at 30 seconds after the simulation is started.

Furthermore, referring to the second simulation result of FIG. 10, a difference Vsensing–$V_C$ (Sensing error) between the voltage Vsensing supplied to the battery and the open-circuit voltage $V_C$ of the internal capacitor 201 having a constant value does not converge to a constant value. Therefore, it is impossible to estimate values only using the voltage Vsensing supplied to the battery 110 and the open-circuit voltage $V_C$ of the internal capacitor. However, a difference $V_{OC}$–$V_C$ (Estimated error) between the estimated open-circuit voltage $V_{OC}$ of the battery 110 and the open-circuit voltage $V_C$ of the internal capacitor 201 having a constant value converges to 0 (zero) at 30 seconds after the simulation is started. Therefore, when the battery parameter estimation method in accordance with the embodiment of the present invention is used, the open-circuit voltage $V_C$ of the internal capacitor 201 may be accurately estimated at about 30 seconds after the simulation is started.

Figure 11:
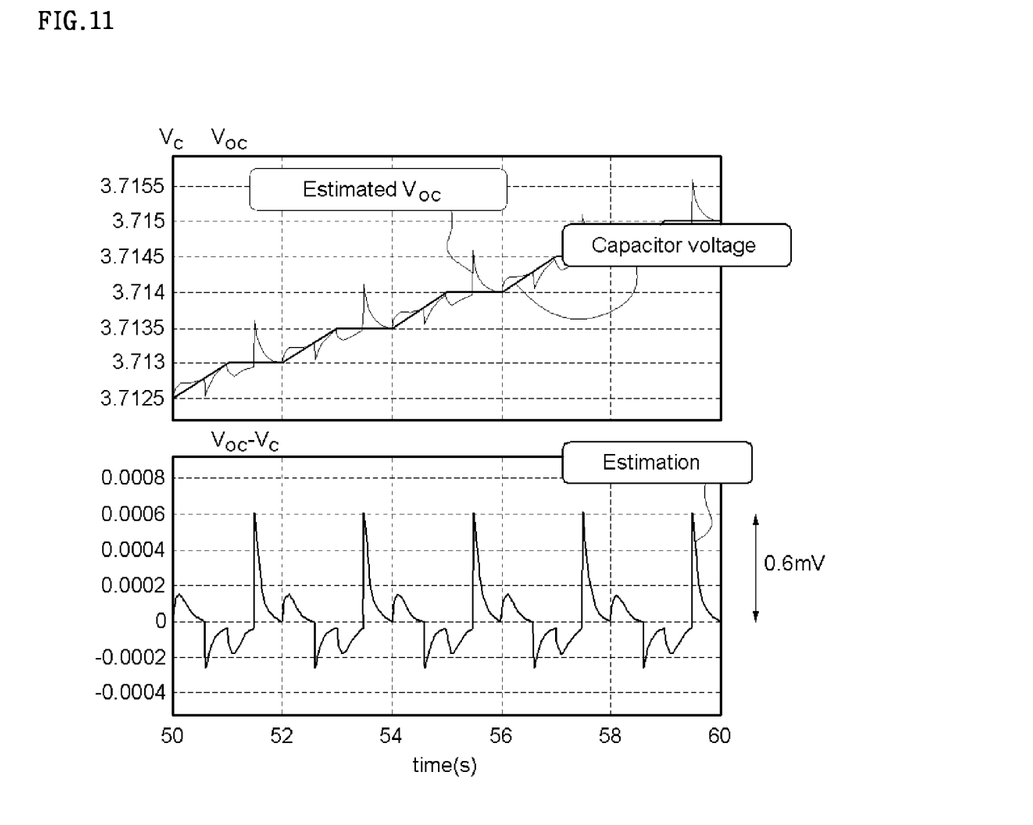
FIG. 11 illustrates the relation between a capacitor voltage and an estimated open-circuit voltage based on estimated impedance in accordance with the embodiment of the present invention.

FIG. 11 illustrates the relation between the capacitor voltage and the estimated open-circuit voltage based on the estimated impedance in accordance with the embodiment of the present invention.

Referring to the relation between the estimated open-circuit voltage (thin solid line) and the actual voltage $V_C$ (thick solid line) of the internal capacitor 201 in an upper diagram of FIG. 11, it can be seen that the estimated open-circuit voltage and the actual voltage of the internal capacitor 201 have similar increase tendencies with respect to time. Furthermore, referring to the difference between the open-circuit voltage $V_{OC}$ and the voltage $V_C$ of the internal capacitor 201 in a lower diagram of FIG. 11, the maximum error is 0.6 mV corresponding to an ignorable error.

Referring to FIG. 11, it can be seen that, when the estimated parameters of the battery model in accordance with the embodiment of the present invention are used, it is possible to estimate the open-circuit voltage $V_{OC}$ with a small estimation error (0.6 mV or less), even though the current is frequently inputted to or outputted from the battery.

In accordance with the embodiments of the present invention, the battery parameter management system and the battery parameter estimation method use the battery estimation model having a simple structure, and may simply estimate the parameters of the elements included in the equivalent model in real time.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A battery parameter management system comprising:
an amperemeter configured to detect an amount of charge current supplied to a battery from a current source or an amount of discharge current supplied from the battery to a load;
a voltmeter configured to measure an open-circuit voltage of the battery;
a control switch unit configured to transmit the charge current supplied from the current source to the battery or transmit the discharge current outputted from the battery to the load in response to a control signal; and
a processor configured to generate the control signal, apply the charge current and the discharge current measured by the amperemeter and the open-circuit voltage measured by the voltmeter to a battery equivalent model of the battery, and estimate parameters of elements forming the battery equivalent model,
wherein the battery equivalent model comprises:
an internal resistor of the battery;
an internal capacitor representing the open-circuit voltage of the battery; and
a parallel circuit comprising a dynamic resistor and a dynamic capacitor which exhibit a non-linear operation characteristic based on an electrochemical reaction inside the battery, wherein the internal resistor, the internal capacitor, and the parallel circuit are connected in series.

2. The battery parameter management system of claim 1, wherein the control signal comprises a charge control signal and a discharge control signal, and
the control switch unit comprises:
a charge control switch configured to switch the charge current supplied from the current source to the battery in response to the charge control signal; and
a discharge control switch configured to switch the discharge current supplied from the battery to the load in response to the discharge control signal.

3. The battery parameter management system of claim 2, wherein the processor sets the charge control signal such that a pulse current having a pulse form with a constant frequency is supplied from the current source to the battery during a part of a charge period in which the charge current is supplied from the current source to the battery, and sets the discharge control signal such that a pulse current having a pulse form with a constant frequency is supplied from the battery to the load during a part of a discharge period in which the discharge current is supplied from the battery to the load.

4. The battery parameter management system of claim 3, wherein the charge control signal and the discharge control signal are set to enable a current supply period within one arbitrary cycle of the pulse current, until the open-circuit voltage of the battery changing in response to the pulse current is saturated.

5. The battery parameter management system of claim 1, further comprising a thermometer configured to measure a temperature of the battery,
wherein the processor estimates a state-of-charge of the battery using the temperature of the battery, the charge current, the discharge current, and the open-circuit voltage of the battery.

6. The battery parameter management system of claim 1, wherein, in the battery equivalent model,
the parallel circuit of the dynamic resistor and the dynamic capacitor has one terminal connected to one terminal of the voltmeter, and
the internal resistor and the internal capacitor of the battery are connected in series to another terminal of the parallel circuit and another terminal of the voltmeter.

7. A battery parameter estimation method of the battery equivalent model, which is applied to the battery parameter management system of claim 1, the battery parameter estimation method comprising:
supplying, by the control switch unit, a pulse current having a constant frequency during a pulse current supply period of a time period in which the battery is charged or discharged;
estimating, by the processor, a resistance of the internal resistor using a variation in the charge current of the battery, a variation in the discharge current of the battery, and a variation of the open-circuit voltage of the battery during a first period of the pulse current supply period;
estimating, by the processor, a capacitance of the internal capacitor using a total amount of charge supplied to the battery, an amount of discharge of the battery, and a variation of the open-circuit voltage of the battery during a second period of the pulse current supply period; and
estimating, by the processor, a resistance of the dynamic resistor and a capacitance of the dynamic capacitor using a variation in the charge current of the battery, a variation in the discharge current of the battery, a variation of the open-circuit voltage of the battery, and time constants of the dynamic resistor and the dynamic capacitor during a third period of the pulse current supply period.

8. The battery parameter estimation method of claim 7, wherein the first to third periods are decided by a frequency of the pulse current,
the first period comprises a period in which impedance of the battery is equalized to the resistance of the internal resistor,
the second period comprises a period in which the impedance of the battery has a value which is inverse proportional to a product of the capacitance of the internal capacitor and the frequency, and
the third period comprises a period in which the impedance of the battery has a value equal to a sum of the resistance of the dynamic resistor and the resistance of the internal resistor.

9. The battery parameter estimation method of claim 8, wherein the resistance $R_S$ of the internal resistor at the estimating of the resistance of the internal resistor is estimated by the following equation:

$$R_s = \frac{\Delta V}{\Delta I}$$

where $\Delta V$ represents a variation of the open-circuit voltage of the battery during a first sensing period corresponding to a transition period of the pulse current used in the first period, and $\Delta I$ represents a variation of the charge current supplied to the battery during the first sensing period.

10. The battery parameter estimation method of claim 8, wherein the capacitance $C_i$ of the internal capacitor at the estimating of the capacitance of the internal capacitor is estimated by the following equation:

$$C_i = \frac{\Delta Q}{\Delta V_{OC}} = \frac{\int_0^{\Delta t} i(t)dt}{\Delta V_{OC}}$$

where ΔQ represents the total amount of charge supplied to the battery during a second sensing period including a plurality of cycles of the pulse current used in the second period, i represents the charge current supplied to the battery, and $\Delta V_{OC}$ represents a variation in maximum value of the open-circuit voltage of the battery changed by the total charge amount.

11. The battery parameter estimation method of claim 10, wherein the estimating of the resistance of the dynamic resistor and the capacitance of the dynamic capacitor comprises:
estimating the resistance of the dynamic resistor using a variation of the charge current supplied to the battery and a variation of the open-circuit voltage of the battery during a third sensing period including a part of one cycle of the pulse current used in the third period; and
estimating the capacitance of the dynamic capacitor using the resistance of the dynamic resistor and the time constants during a fourth sensing period including the other part of the one cycle of the pulse current used in the third period.

12. The battery parameter estimation method of claim 11, wherein the third sensing period comprises a time period in which an amplitude of the charge current rapidly increases and maintains a constant current value during one cycle of the pulse current supplied in the pulse form and a time period in which the battery voltage is saturated with a predetermined value in response to the increase of the charge current, and
the fourth sensing period comprises a time period in which the amplitude of the charge current rapidly decreases and maintains a constant current value after the third period passes during the one cycle of the pulse current supplied in the pulse form and a time period in which the battery voltage is saturated with a predetermined value in response to the decrease of the charge current.

13. The battery parameter estimation method of claim 12, wherein the resistance $R_d$ of the dynamic resistor is estimated by the following equation:

$$R_d = \frac{V(t_3) - V(t_2)}{\Delta I}$$

where $t_2$ represents a time point when the amplitude of the charge current supplied to the battery rapidly increases, $t_3$ represents a time point when the amplitude of the battery voltage is saturated within the third sensing period, and ΔI represents a variation of the charge current supplied to the battery.

14. The battery parameter estimation method of claim 13, wherein the capacitance $C_d$ of the dynamic capacitor is estimated by the following equation:

$$C_d = \text{average}\left(\frac{t_5 - t_4}{R_d}, \frac{t_6 - t_4}{2R_d}, \frac{t_7 - t_4}{3R_d}\right)$$

where $R_d$ represents the resistance of the dynamic resistor, $t_4$ represents a time point at which the charge current rapidly decreases, $t_5$ represents a time point at which the time constant is 1, $t_6$ represents a time point at which the time constant is 2, and $t_7$ represents a time point at which the time constant is 3.

15. The battery parameter estimation method of claim 14, wherein the time points included in the equation satisfy the following equations:

$$V(t_4) - V(t_5) \geq (1-e^{-1})\Delta V_d \approx 0.632\Delta V_d;$$

$$V(t_4) - V(t_6) \geq (1-e^{-2})\Delta V_d \approx 0.865\Delta V_d;$$

$$V(t_4) - V(t_7) \geq (1-e^{-3})\Delta V_d \approx 0.950\Delta V_d \quad \text{[Equation 11]}$$

where $\Delta V_d$ represents the value of the battery voltage at the time point $t_4$.

16. The battery parameter estimation method of claim 7, wherein the supplying of the pulse current is set to enable the current supply period within one arbitrary cycle of the pulse period, until the open-circuit voltage of the battery changing in response to the pulse current is saturated.

* * * * *